United States Patent [19]
Lim

[11] Patent Number: 5,146,312
[45] Date of Patent: Sep. 8, 1992

[54] INSULATED LEAD FRAME FOR SEMICONDUCTOR PACKAGED DEVICES

[76] Inventor: Thiam B. Lim, 39 Elias Road, #02-04 Pasir Ris Gardens, Singapore

[21] Appl. No.: 662,085

[22] Filed: Feb. 28, 1991

[51] Int. Cl.$^5$ ............................................. H01L 23/48
[52] U.S. Cl. ...................................... 357/70; 357/52; 357/55; 357/72
[58] Field of Search .................. 357/70, 52, 55, 72

[56] References Cited

U.S. PATENT DOCUMENTS 4,801,999  1/1989  Hayward et al. ...................... 357/70
4,862,245  8/1989  Pashby et al. ......................... 357/70

Primary Examiner—Edward J. Wojciechowicz
Attorney, Agent, or Firm—Robby T. Holland; Rene' E. Grossman; Richard L. Donaldson

[57] ABSTRACT

An insulated lead frame is disclosed. The lead frame has a first plurality of lead fingers and a second plurality of lead fingers. It also has a power supply bus lying between the first plurality of lead fingers and the second plurality of lead fingers. An insulating strip lies on a face of the power supply bus near an edge of the face. Examples of a suitable dielectric strip are an adhesive type tape, such as a polyimide tape, and a nonconductive liquid, such as liquid polyimide. An insulated lead frame is useful in the manufacture of packaged semiconductor integrated circuit devices to reduce the possibility of wire bond shorting to the power supply busses. One example is a dynamic random access memory, DRAM, die having centrally disposed bonding pads mounted to a lead on chip lead frame. The power supply busses of the lead on chip lead frame have dielectric strips running along their edges to reduce the possibility of shorting between the power supply busses and the crossing wire bonds that connect the lead fingers of the lead frame to the bonding pads of the DRAM.

4 Claims, 8 Drawing Sheets 5,146,312

INSULATED LEAD FRAME FOR SEMICONDUCTOR PACKAGED DEVICES

FIELD OF THE INVENTION

This invention relates to integrated circuits, and more particularly relates to integrated circuit packages.

BACKGROUND OF THE INVENTION

An integrated circuit packaged device generally includes an integrated circuit chip lying on a chip support pad. Wire bonds connect the IC to a lead frame. A substance, such as plastic, encapsulates the structure. The plastic small outline J lead (PSOJ) package is one exemplary example. For application, one technique uses reflow solder to surface mount the IC package to a printed circuit board.

As the industry moves towards thinner packages and packages containing chips of larger size for higher volumetric packaging, new packaging techniques are evolving. One such technique is the lead on chip package, (LOC). As described in U.S. Pat. No. 4,862,245 to Pashby et al., issued Aug. 29, 1989, and in U.S. Pat. No. 4,916,519 to Ward, issued Apr. 10, 1990, and in the article entitled *Volume Production of Unique Plastic Surface Mount Modules For The IBM 80-ns 1-Mbit DRAM Chio by Area Wire Bond Techniques* by William C. Ward, published at the 38th ECC in IEEE 1988, pages 552–557, this technique disposes a lead frame over the active area of an integrated circuit. Adhesive insulating tape attaches the lead frame to the integrated circuit chip. Wire bonds connect the circuit to the centrally disposed power supply busses. And, wire bonds jump over the power supply busses to connect the integrated circuit to conductive lead fingers. No chip support pad is required.

Concerns exist about potential wire bond shorting to the power bus portions of the lead frame in the LOC package. Since the wires to the signal pins cross the metal lead frame power bus, the opportunity for shorting may arise from assembly processes such as poor bond location, wire loop control, mold compound sweep, or from accidental touching during processing. These assembly processes also create concerns about shorting between the wirebonds themselves.

One approach to minimize shorting problems suggests the use insulated wire. See, *Insulated Aluminum Bonding Wire For High Lead Count Packaging* by Alex J. Oto, International Journal For Hybrid Microelectronics, Vol. 9, No. 1, 1986. While insulated wire has been reported to have some degree of success in conventional assembly packages, the successful implementation in a LOC package is questionable due to the nature of the wire bond stitch as it occurs over the insulating film on top of the integrated circuit; the probability of successful implementation is therefore less likely. Additionally, insulated wire is expensive.

It is an object of this invention to provide a solution to wire bond shorting in lead on chip integrated circuit packaged devices.

Other objects and benefits of this invention will be apparent to those of ordinary skill in the art having the benefit of the description to follow herein.

SUMMARY OF THE INVENTION

An insulated lead frame is disclosed. The lead frame has a first plurality of lead fingers and a second plurality of lead fingers. It also has a power supply bus lying between the first plurality of lead fingers and the second plurality of lead fingers. An insulating strip lies on a face of the power supply bus near an edge of the face. Examples of a suitable dielectric strip are an adhesive type tape, such as a polyimide tape, and a nonconductive liquid, such as liquid polyimide. An insulated lead frame is useful in the manufacture of packaged semiconductor integrated circuit devices to reduce the possibility of wire bond shorting to the power supply busses. One example is a dynamic random access memory, DRAM, die having centrally disposed bonding pads mounted to a lead on chip lead frame. The power supply busses of the lead on chip lead frame have dielectric strips running along their edges to reduce the possibility of shorting between the power supply busses and the crossing that connect the lead fingers of the lead frame to the bonding pads of the DRAM.

BRIEF DESCRIPTION OF THE DRAWINGS

FIG. 4a is an enlarged partial end view of FIG. 4.

FIG. 5a is an enlarged partial end view of FIG. 5.

DETAILED DESCRIPTION OF SPECIFIC EMBODIMENT

Figure 1:
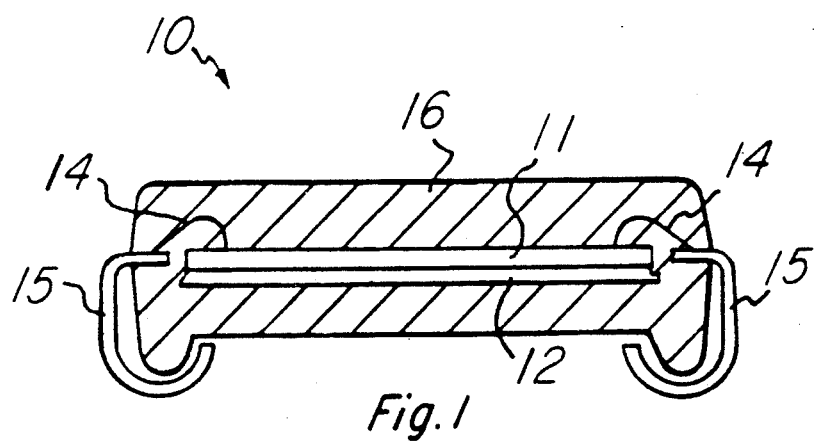
FIG. 1 is a cross section view of a typical integrated circuit package.

FIG. 1 illustrates an integrated circuit packaged device 10 constructed in the industry standard plastic small outline J-leaded (PSOJ) surface mount package. A semiconductor integrated circuit chip 11 rests on a mount support pad (chip attach) 12. Wire bonds 14 connect the bonding pads (not shown) located along the outer edges of semiconductor circuit 11 to conductive "J" shaped lead fingers 15. A mold compound material 16 such as plastic encapsulates the components.

Figure 2:
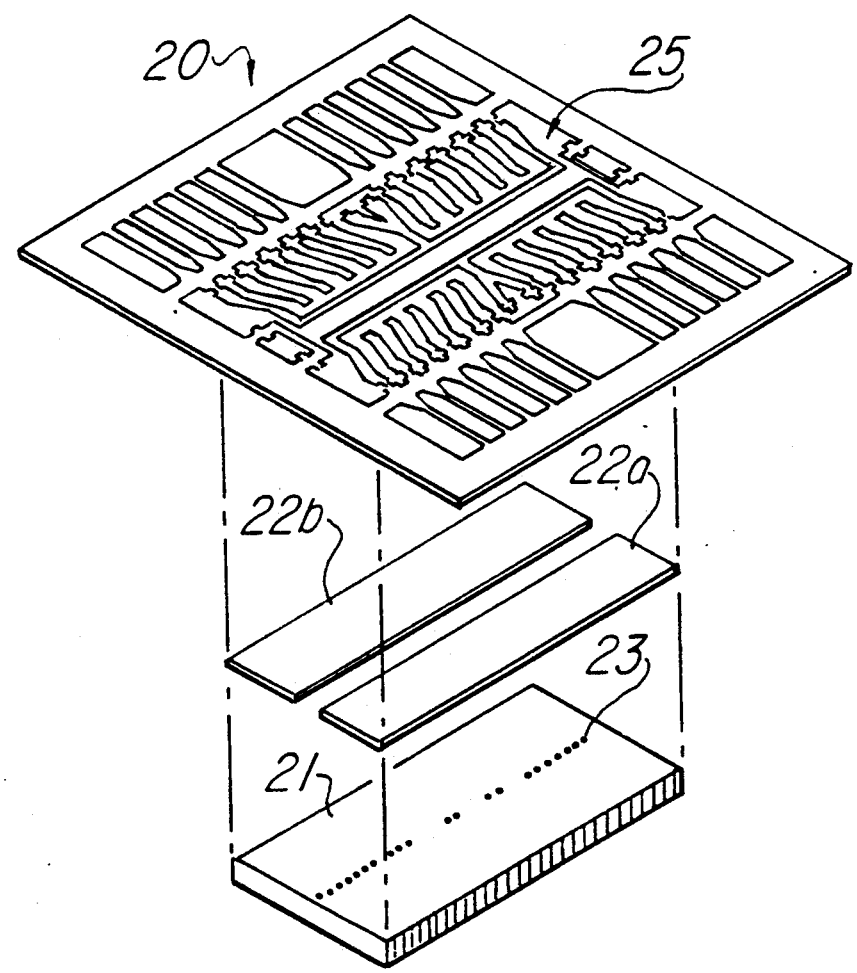
FIG. 2 is a perspective, exploded view of a lead on chip center bond device illustrating the lead frame, adhesive tape, and integrated circuit.

FIG. 2 illustrates an initial stage of the LOC concept. The following copending and coassigned applications also describe the LOC concept:

| Ser. No. | Inventor | Filed | TI-Docket |
| --- | --- | --- | --- |
| 373,742 | Heinen, et al. | 06/30/89 | 14287 |
| 455,210 | Lim, et al. | 12/22/89 | 14600 |

-continued

| Ser. No. | Inventor | Filed | TI-Docket |
|---|---|---|---|
| 455,105 | Lim, et al. | 12/22/89 | 14603 |

In packaged device 20 of FIG. 2, the bond pads 23 lie along the central horizontal axis of semiconductor integrated circuit chip 21. Semiconductor 21 lies beneath lead on chip lead frame 25. Lead on chip lead frame 25 may be formed of conductive metal. An example is full hard temper CDA alloy 151 about 0.008 inches thick that may be spot plated in gold, silver, or the like. Another example is half hard alloy 42. Semiconductor chip 21 may be, for example, a 16 Megabit Dynamic Random Access Memory (DRAM) storing more than 16 million data bits on a semiconductor substrate about 325×660 mils. Two pieces of double sided adhesive tape 22a and 22b are disposed over the top active surface of semiconductor circuit 21 and attach lead frame 25 over the top of chip 21. It is this configuration that leads to the description "lead on chip", (LOC). The centrally disposed bond pads 23 lead to the further description "lead on chip center bond", (LOCCB). Double sided adhesive tape 22a and 22b may comprise, for example, a double sided thermosetting epoxy adhesive coated polyimide film that also acts as an active barrier. One such commercially available tape containing a polyimide film is sold under the trade name Dupont Kapton. The chip 21 and the lead frame 25 form a self supporting structure. No chip support pad is required.

Figure 2A:
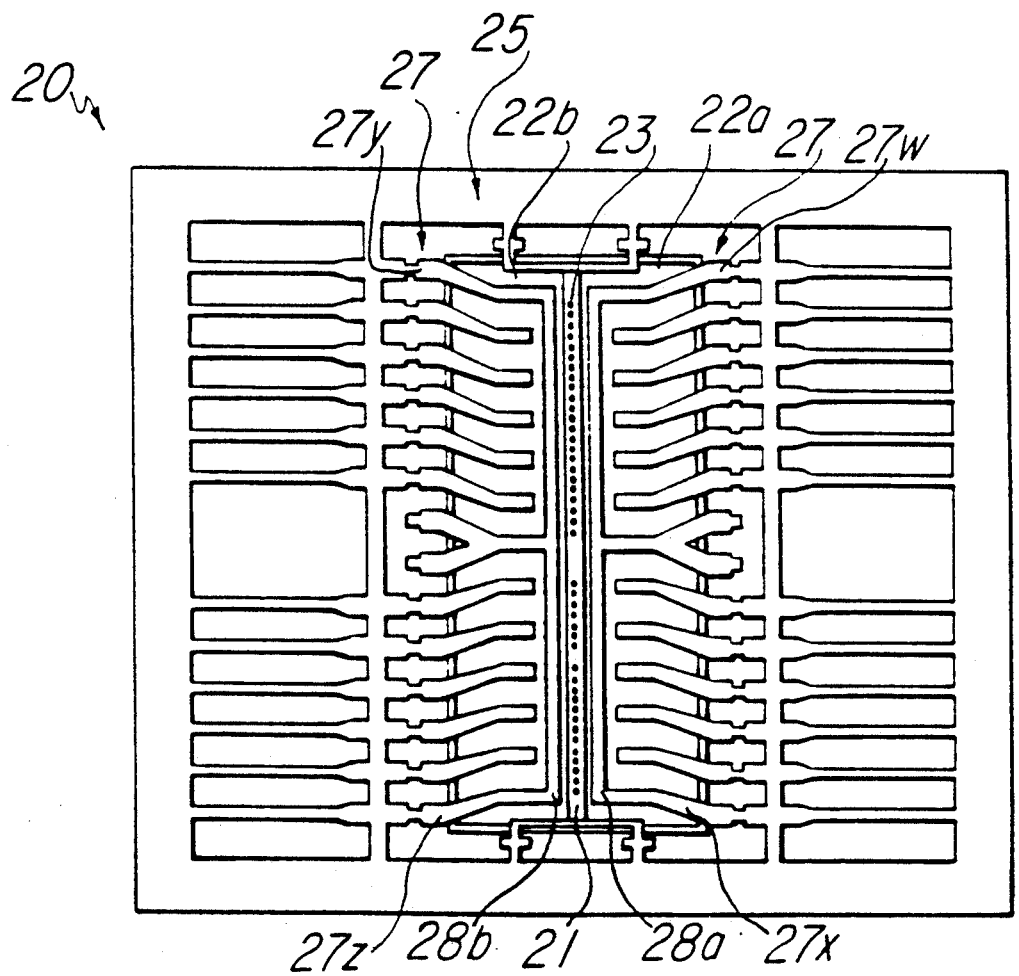
FIG. 2a is a top view of the lead on chip center bond device illustrating the connection of the integrated circuit chip thereunder.

FIG. 2a depicts the resulting structure when the lead frame 25 is affixed over the integrated circuit 21 in the manner shown in FIG. 2. The power busses 28a and 28b are part of the lead frame material and comprise spaced apart parallel conductive busses that run along the middle of the chip 21. Power supply bus 28a is connected between lead fingers 27w and 27x and may provide, for example, ground voltage Vss. Power supply bus 28b is connected between lead fingers 27y and 27z and may provide, for example, positive voltage Vdd. The adhesive tapes 22a and 22b are spaced apart such that the bond pads 23 of chip 21 are exposed for bonding to the conductive lead fingers 27 of lead frame 25.

Figure 2B:
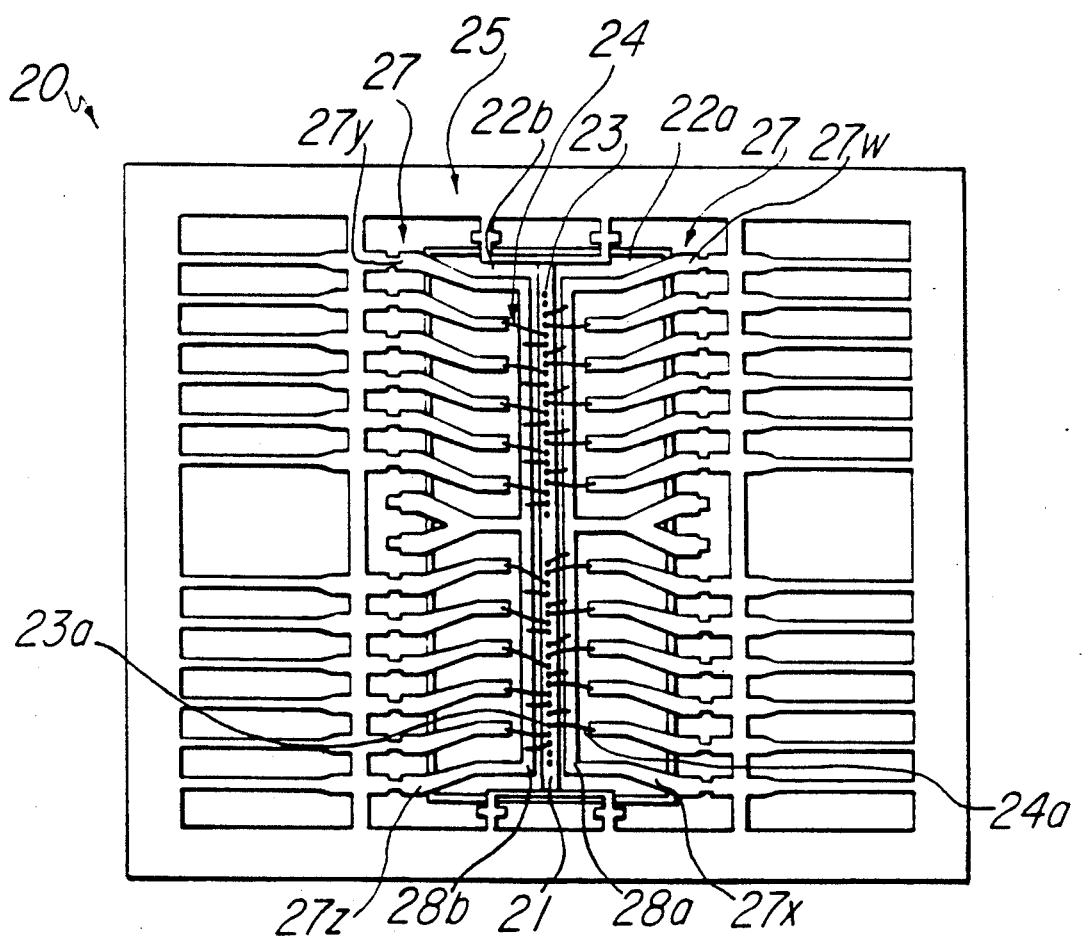
FIG. 2b is a top view of the lead on chip center bond device illustrating the connecting wire bonds.

FIG. 2b illustrates a subsequent assembly stage of packaged device 20 wherein high speed thermosonic gold ball wire bonding is accomplished to connect the bond pads 23 to various lead fingers 27 and to the power supply busses 28a and 28b. While various types of wire bonding may be utilized, gold wire bonds of about 0.001 inches diameter are sufficient. One end of the wire bonds 24 are connected to various of the bond pads 23. The other end of various wire bonds 24 are connected to the two centrally disposed power supply busses 28a and 28b of lead frame 25. Multiple wire bond contacts may be made to these busses to more efficiently distribute voltage. The other end of various wire bonds 24 cross over a power supply bus to make contact with the internal tip ends of the conductive lead fingers 27. Wire bond 24a is exemplary. One end of wire bond 24a is attached to the internal tip end of lead finger 27a. Wire bond 24a passes over power supply bus 28a where the other end of wire bond 24a is connected to bond pad 23a. The internal tip ends of the lead fingers 27 are downset. An undesirable wire sweep could result in wire bond 24a touching power supply bus 28a thereby causing an undesirable short.

Figure 2C:
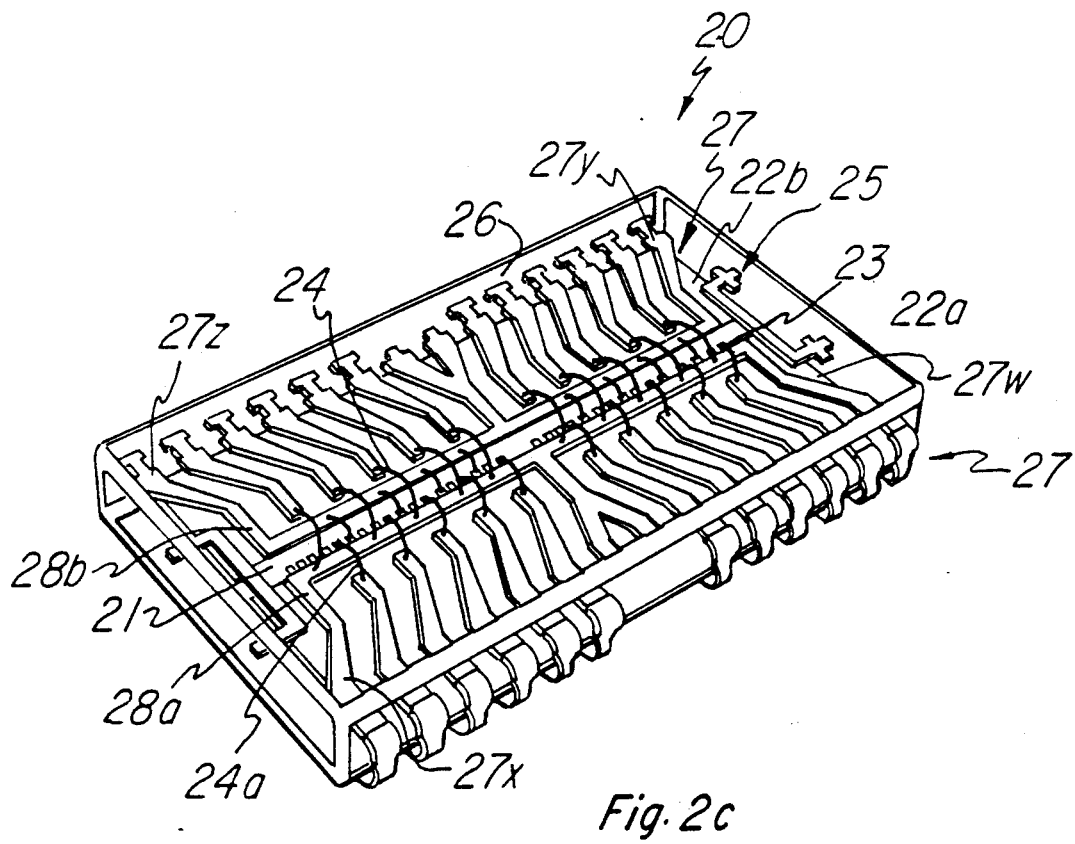
FIG. 2c is a top view of the lead on chip center bond device wherein the encapsulating mold compound is rendered transparent.

FIG. 2c illustrates packaged device 20 in a subsequent assembly stage with the plastic encapsulant 26 rendered transparent. Transfer molding is accomplished using a molding compound such as a Novolac epoxy. Low stress mold techniques work well in encapsulating the device. The plastic encapsulant 26 surrounds the integrated circuit 21, the lead frame 25, and the wire bonds 24 to form a plastic body. The lead frame 25 is trimmed and the lead fingers 27 are bent in the "J" shape with the outer lead finger ends extending through the plastic encapsulant 26 so that suitable physical and electrical connection may be made with external circuitry. There are 24 lead fingers 27 extending through the plastic encapsulant.

Figure 2D:
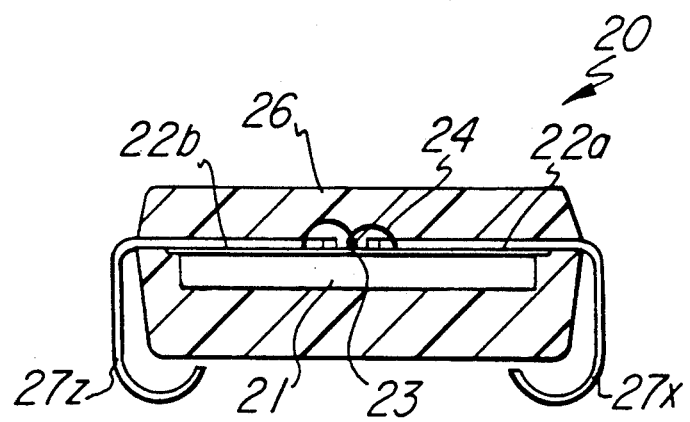
FIG. 2d is a side view of the completed lead on chip center bond package.

FIG. 2d is a side view of the completed lead on chip packaged device 20. The package size for the die size above described may be on the order of about 400×725 mils and may be thinner than about 50 mils. The external appearance of the package is that of a 24 pin PSOJ.

Figure 2E:
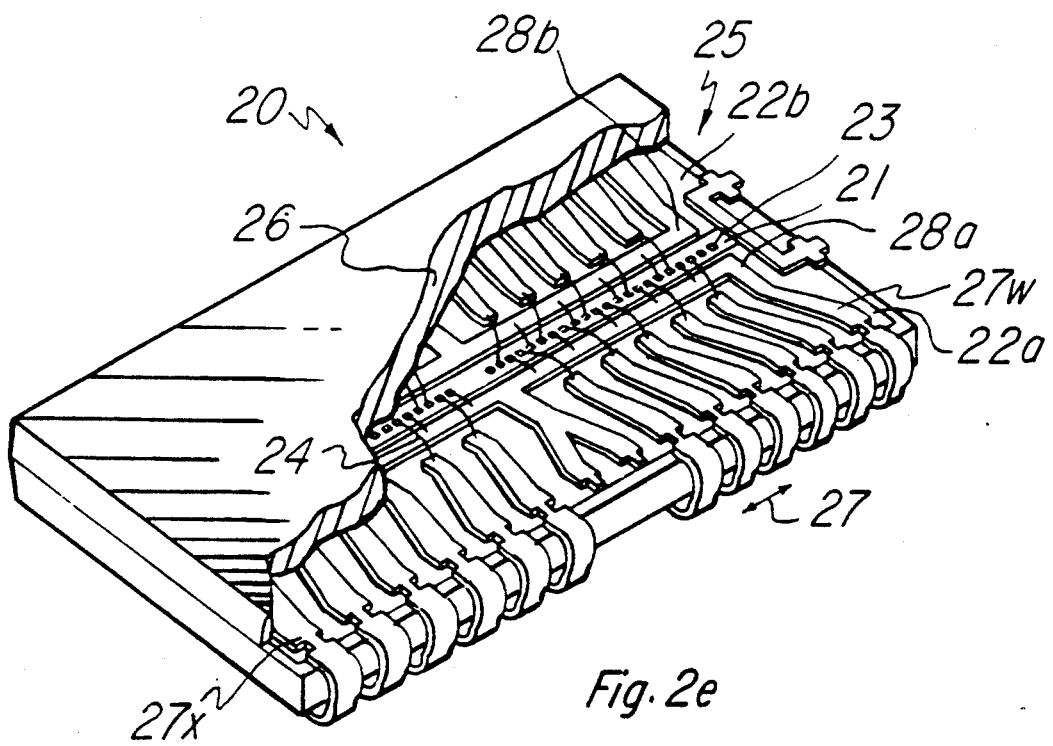
FIG. 2e is a perspective view, partially broken away, of the completed lead on chip center bond integrated circuit package.

FIG. 2e illustrates in perspective a partially cut away view of the finished semiconductor packaged device package 20.

Figure 3:
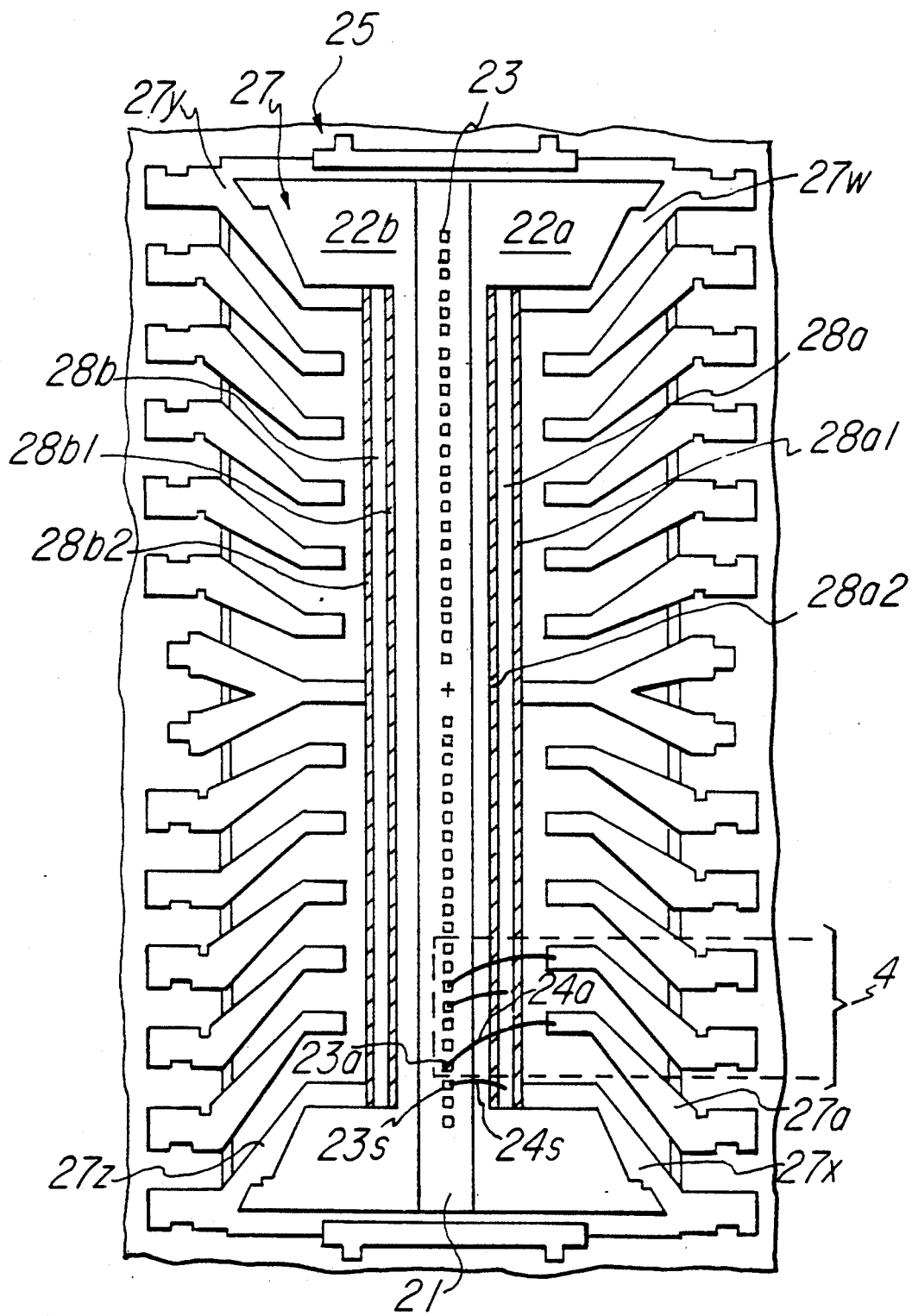
FIG. 3 is partial broken away top view of an altered FIG. 2b, illustrating the preferred embodiment of the invention.
Figure 4:
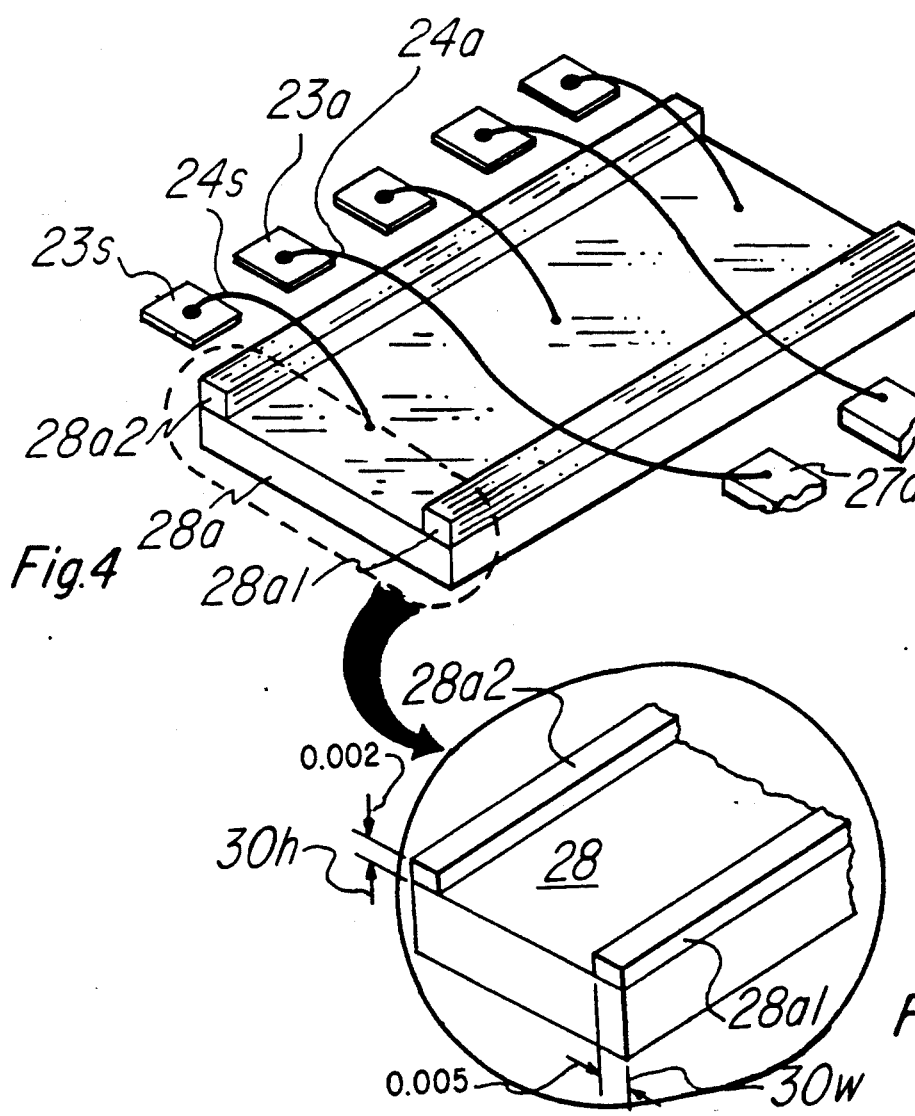
FIG. 4 is a partial perspective view of the preferred embodiment of the invention taken along the line 4—4 of FIG. 3.

FIG. 3 is a partial broken away top view of an altered FIG. 2b illustrating the preferred embodiment of the invention, while FIG. 4 is a perspective view along the line 4—4 of FIG. 3 to further illustrate the preferred embodiment of the invention. (The lead frame 25 is broken away from its outer edges and for clarity, only a few of all the actual wire bonds are illustrated.) FIG. 4a is an enlarged end view of FIG. 4.

Referring now to FIGS. 3, 4, and 4a, insulating, non conductive, strips 28a1 and 28a2 run along the edges on the top face of power supply bus 28a and insulating, nonconductive, strips 28b1 and 28b2 run along the edges on the top of power supply bus 28b. Portions of the surface of power supply busses 28a and 28b between the insulating strips are left exposed for bonding purposes. Wire bond 24s extends from bond pad 23s. It passes over insulator strip 28a2 and connects to power supply bus 28a. Wire bond 24a extends from bond pad 23a. It passes over insulator strips 28a2 and 28a1 and connects to the internal tip end of lead finger 27a. The insulator strips protect crossing wire bonds from collapsing against the power supply busses and shorting. Should wire bond 24a unfortunately collapse, it should rest against nonconductive strip 28a1, against nonconductive strip 28b2, or against both nonconductive strips 28a1 and 28a2 and therefore not short to power supply bus 28a.

In the preferred embodiment of the invention, the insulating strips 28a1, 28a2, 28b1, and 28b2 are formed out of an insulating adhesive tape. A single sided adhesive tape is sufficient to adhere the nonconductive strips to the power supply busses, although the double sided adhesive tape 22 described above works also. Suitable examples are the Dupont "Kapton" tape and an Upliex tape. These tapes contain a thermosetting epoxy adhesive polyimide film that acts as an active barrier.

The size of the dielectric strips should be such so as to eliminate electrical transmission through it while allowing a sufficient area of the power supply busses exposed for wire bonding purposes; the insulating strips should be large enough to prevent electrical contact between a wire bond resting against the strip and the power supply bus, but not too big so that they interfere with wire bonding to the power supply busses. Suitable dimensions, as illustrated in FIG. 4a, include a tape strip height 30h of approximately 0.002 inches and a tape strip width 30w of approximately 0.005 inches. These sizes leave a sufficient area of the power supply busses, that are approximately 0.015 inches wide, exposed for the bond wires to be connected to them.

Figure 5:
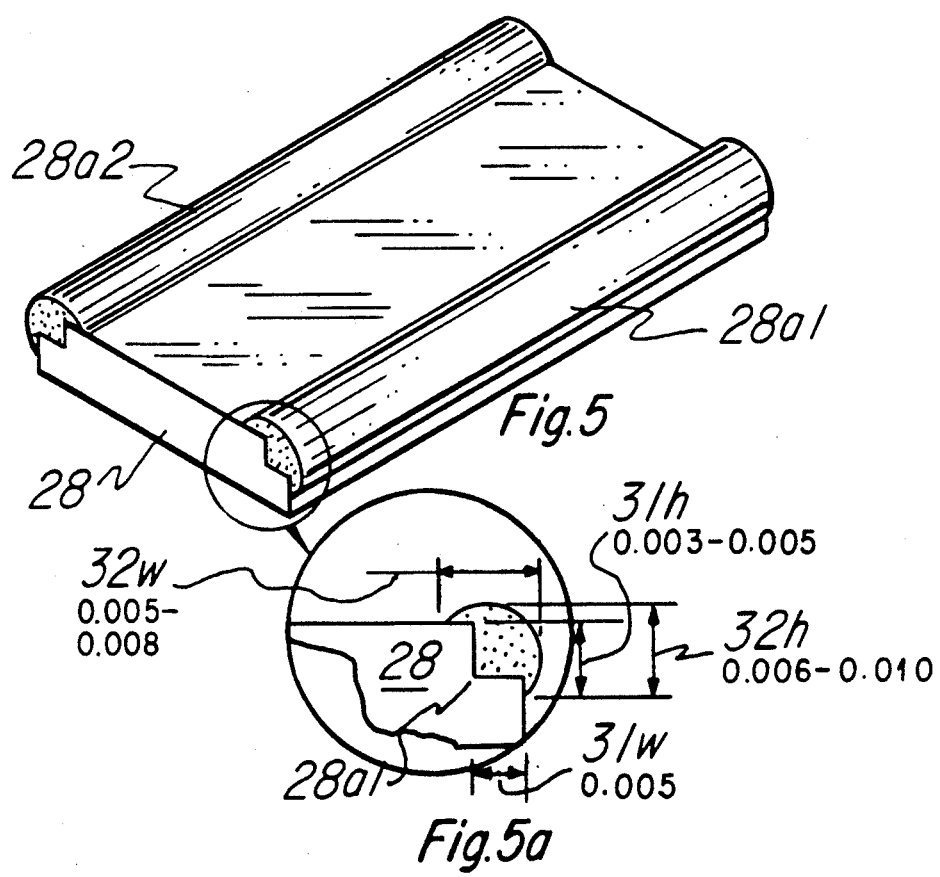
FIG. 5 is an enlarged partial end view of FIG. 4 illustrating an alternative embodiment of the invention.

FIG. 5 illustrates an alternative embodiment for the composition of the insulating strips. Here, the insulator strips 28a1 and 28a2 are formed from a nonconductive liquid. The copending, cofiled, and coassigned application of Texas Instruments entitled "Insulated Lead Frame For Integrated Circuits And Method of a Thereof" by Lim, et al, Ser. No. 662,082, filed Feb. 28, 1991, incorporated herein by reference, discloses a suitable method of putting the nonconductive liquid material on the power supply busses. Liquid polyimide is the preferred liquid insulating material of this alternative embodiment. The liquid insulator is applied along the edges of the power supply busses and after curing, has a curved outer topography resembling a bead, or half roll strip, along the edges.

To facilitate reception by the power supply busses of the liquid insulator, the power supply busses are preferably notched, or stepped, along the edges before the liquid insulator is applied. This helps the liquid stay on the edge of the power supply busses and not drain or slide off. More importantly, the insulating material on the step reduces the possibility of shorts occurring at the edge of the power supply busses. Referring to FIG. 5a, a step width 31w of approximately 0.005 inches and a step height 31h of approximately 0.003 to 0.005 inches works well. The size of the cured liquid insulating strips should be such to eliminate electrical transmission between a power supply bus and a touching crossing wire bond, while allowing a sufficient area of the power supply busses exposed for wire bonding purposes. Applying the liquid polyimide on the step size given above, the width, 32w, of this curred liquid strip 28a1 is approximately between 0.005 to 0.008 inches, and the height 32h, measured from the step bottom to the highest point on the curved outer topography, is between about 0.006 to 0.010 inches. The outer portion of cured liquid insulator strip 28a1 thus extends above the step height 31h and over the step edges.

The insulated lead frame thus has a first set of lead fingers, a second set of lead fingers, and at least one power supply bus lying between them. An insulating strip lies on a face of the power supply bus near an edge of the face. Examples of a suitable dielectric strip are an adhesive type tape, such as a polyimide tape, and a nonconductive liquid, such as liquid polyimide. Another insulating strip may lie on the face of the power supply bus near the other edge of the face. Such an insulated lead frame is useful in the manufacture of packaged semiconductor integrated circuit devices to reduce the possibility of wire bond shorting to power supply busses. For example, in a dynamic random access memory, DRAM, die having centrally disposed bonding pads mounted to a lead on chip lead frame, the power supply busses of the lead on chip lead frame have dielectric strips running along their edges to reduce the possibility shorting between the power supply busses and the crossing wire bonds that connect the lead fingers of the lead frame to the bonding pads of the DRAM.

Aside from advantageously reducing the possibility of undesirable wire bond shorting, the insulator strips provide the further advantages. They can be applied by the lead frame manufacturer and thus save the integrated circuit manufacturer extra process steps during assembly of the device. They readily accommodate changes in bond pad locations without impacting wire bonding location along the power supply busses and over the power supply busses. Also, they aid in the creation of very thin integrated circuit packages. The wire height between the power supply busses and the wire bonds that cross over them may be decreased since the possibility of wire bond shorting is reduced. Overall package height may accordingly be reduced. These insulating strips may similarly used in chip on lead packaged devices as well.

While this invention has been described with reference to illustrative embodiments, this description is not intended to be construed in a limiting sense. For example, the invention works well on chip on lead frames wherein the semiconductor chip resides over the lead frame. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A semiconductor chip, comprising:
a semiconductor die having a plurality of bonding pads centrally disposed along a face thereof;
a lead frame having lead fingers extending over the face of the semiconductor die and having two power supply buses adjacent to the bonding pads, each having a top face disposed opposite the face of the semiconductor die;
a plurality of wire bonds, some that cross over the top face of a power supply bus for connecting some of the centrally disposed bonding pads to some of the plurality of lead fingers, and some that connect other of the centrally disposed bonding pads to the top faces of the power supply busses;
an encapsulated, encapsulating the semiconductor die, the wire bonds, and the lead frame such that portions of the lead fingers extend through the encapsulant; and
dielectric strips disposed along opposite edges of the top face of the power supply busses, leaving a portion of the top face of the power supply busses uncovered so that connections from some of the wire bonds may be made, to reduce the possibility of a crossing wire bond from collapsing against a power supply bus.

2. The semiconductor chip of claim 1 wherein the dielectric strips are comprised of adhesive polyimide tape having a height of approximately 0.002 inches and a width of approximately 0.005 inches.

3. The semiconductor chip of claim 1 wherein the dielectric strips are comprised of cured liquid polyimide.

4. The semiconductor chip of claim 3 wherein the top face of the power supply bus edges on which the cured liquid polyimide is disposed are stepped.

* * * * *